United States Patent
Han et al.

(10) Patent No.: US 12,300,500 B2
(45) Date of Patent: May 13, 2025

(54) ETCHING OF POLYCRYSTALLINE SEMICONDUCTORS

(71) Applicant: Tokyo Electron Limited, Tokyo (JP)

(72) Inventors: Yun Han, Albany, NY (US); Alok Ranjan, Austin, TX (US); Tomoyuki Oishi, Miyagi (JP); Shuhei Ogawa, Miyagi (JP); Ken Kobayashi, Miyagi (JP); Peter Biolsi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 555 days.

(21) Appl. No.: 17/690,715

(22) Filed: Mar. 9, 2022

(65) Prior Publication Data
US 2023/0317462 A1    Oct. 5, 2023

(51) Int. Cl.
*H01L 21/3065*    (2006.01)
*H10D 84/01*    (2025.01)
*H10D 84/03*    (2025.01)

(52) U.S. Cl.
CPC ..... *H01L 21/3065* (2013.01); *H10D 84/0158* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 8,916,477 B2 | 12/2014 | Thedjoisworo et al. | |
| 9,318,343 B2 | 4/2016 | Ranjan et al. | |
| 9,997,352 B2 | 6/2018 | Bi et al. | |
| 10,896,816 B2 | 1/2021 | Bi et al. | |
| 2006/0046205 A1 | 3/2006 | Hah et al. | |
| 2008/0286978 A1* | 11/2008 | Chen | H01L 21/30655 438/713 |
| 2019/0386115 A1 | 12/2019 | Lin et al. | |
| 2020/0075342 A1* | 3/2020 | Chen | H01L 21/31144 |
| 2021/0074550 A1* | 3/2021 | Shimizu | H01L 21/31144 |
| 2021/0193477 A1 | 6/2021 | Ishikawa et al. | |
| 2021/0351281 A1 | 11/2021 | Lin et al. | |

FOREIGN PATENT DOCUMENTS

| WO | WO2019239991 | * 6/2019 |
|---|---|---|
| WO | 2020223152 A1 | 11/2020 |

OTHER PUBLICATIONS

International Search Report and Written Opinion, PCT Application No. PCT/US2023/014748, mailed Jun. 22, 2023, 9 pages.

(Continued)

*Primary Examiner* — Stephanie P Duclair
(74) *Attorney, Agent, or Firm* — Slater Matsil, LLP

(57) ABSTRACT

A method of processing a substrate that includes: performing a cyclic plasma etch process including a plurality of cycles, each of the plurality of cycles including: etching a patterning layer including a polycrystalline semiconductor material to form or extend a recess by exposing the substrate to a first plasma, the substrate including an oxide layer, the patterning layer formed over the oxide layer, exposing the substrate to a second plasma, the second plasma including dihydrogen, and extending the recess by exposing the substrate to a third plasma, the second plasma being different from the first plasma and the third plasma.

21 Claims, 8 Drawing Sheets

(56) References Cited

OTHER PUBLICATIONS

Kim et al., "A study of the role of HBr and oxygen on the etch selectivity and the post-etch profile in a polysilicon/oxide etch using HBr/O2 based high density plasma for advanced DRAMs", Materials Science in Semiconductor Processing 10 (2007), pp. 41-48, 2006 Elsevier Ltd., 8 pages total.

Sato et al., "Anisotropic etching rates of single-crystal silicon for TMAH water solution as a function of crystallographic orientation", 1999 Elsevier Science S.A., Sencors and Actuators 73 (1999) pp. 131-137. 7 pages total.

* cited by examiner

ETCHING OF POLYCRYSTALLINE SEMICONDUCTORS

TECHNICAL FIELD

The present invention relates generally to a method of processing a substrate, and, in particular embodiments, to etching of polycrystalline semiconductors.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using plasma processes.

The semiconductor industry has repeatedly reduced the minimum feature sizes in semiconductor devices to a few nanometers to increase the packing density of components. Accordingly, the semiconductor industry increasingly demands plasma-processing technology to provide processes for patterning features with accuracy, precision, and profile control, often at atomic scale dimensions. These requirements are particularly stringent for three-dimensional (3D) structures, for example, a fin field-effect transistor (FinFET) wherein the gate electrode wraps around three sides of closely-spaced, narrow and long fin-shaped semiconductor features formed by etching trenches into the semiconductor substrate. Meeting this challenge along with the uniformity and repeatability needed for high volume IC manufacturing requires further innovations of plasma processing technology.

SUMMARY

In accordance with an embodiment of the present invention, a method of processing a substrate that includes: performing a cyclic plasma etch process including a plurality of cycles, each of the plurality of cycles including: etching a patterning layer including a polycrystalline semiconductor material to form or extend a recess by exposing the substrate to a first plasma, the substrate including an oxide layer, the patterning layer formed over the oxide layer, exposing the substrate to a second plasma, the second plasma including dihydrogen, and extending the recess by exposing the substrate to a third plasma, the second plasma being different from the first plasma and the third plasma.

In accordance with an embodiment of the present invention, a method of processing a substrate that includes: performing a cyclic plasma etch process including a plurality of cycles, each of the plurality of cycles including: etching a polysilicon layer to form a recess by exposing the substrate to a first plasma for a first duration, the substrate including an oxide layer, the polysilicon layer formed over the oxide layer, the first plasma including hydrogen bromide and dichlorine, and exposing the substrate to a second plasma for a second duration, the second plasma including dihydrogen.

In accordance with an embodiment of the present invention, a method of fabricating a fin field-effect transistor that includes: forming a fin feature over an oxide layer, the oxide layer formed over the substrate, the fin feature including a fin hard mask and a fin under the fin hard mask, the fin including silicon; depositing a dummy gate material including polysilicon; depositing a gate hard mask layer over the dummy gate material; depositing a photoresist over the hard mask layer; performing a photolithographic process to pattern the photoresist; etching the gate hard mask layer to transfer a pattern from the photoresist to the hard mask layer; and performing a cyclic plasma etch process using the gate hard mask layer as an etch mask, the cyclic plasma etch process exposing the fin hard mask, the cyclic plasma etch process including a plurality of cycles, each of the plurality of cycles including: etching the dummy gate material to form a recess by exposing the substrate to a first plasma, the first plasma including a halogen; and exposing the substrate to a second plasma, the second plasma including hydrogen.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1G illustrate cross sectional views of an example substrate during an example cyclic plasma process at various stages in accordance with various embodiments, wherein FIG. 1A illustrates an incoming substrate comprising polysilicon, a hard mask layer, and a patterned photoresist layer, FIG. 1B illustrates the substrate after a hard mask open step, FIG. 1C illustrates the substrate after a first main etch with a first plasma of the cyclic plasma process, FIG. 1D illustrates the substrate after a first hydrogen treatment of the cyclic plasma process with a second plasma, FIG. 1E illustrates the substrate after cycles of steps of the cyclic plasma process, FIG. 1F illustrates the substrate after a surface treatment to form a protective surface layer, and FIG. 1G illustrates the substrate after a soft-landing etch with a third plasma;

FIGS. 2A-2E illustrate perspective views of an example substrate during an example cyclic plasma process for fabricating a three-dimensional (3D) semiconductor device at various stages in accordance with various embodiments, wherein FIG. 2A illustrates an incoming substrate comprising an oxide layer, a fin feature, a polysilicon layer, a hard mask layer, and a patterned photoresist layer, FIG. 2B illustrates the substrate after a hard mask open step, FIG. 2C illustrates the substrate after cycles of steps of the cyclic plasma process, FIG. 2D illustrates the substrate after a surface treatment to form a protective surface layer, and FIG. 2E illustrates the substrate after a soft-landing etch forming a dummy gate feature wrapping the fin feature; and FIGS. 3A-3C illustrate process flow charts of methods of cyclic plasma process in accordance with various embodiments, wherein FIG. 3A illustrates some embodiment process flows, FIG. 3B illustrates alternate embodiment process flows, and FIG. 3C illustrates yet other embodiment process flows.

DETAILED DESCRIPTION OF ILLUSTRATIVE EMBODIMENTS

This application relates to a method of processing a substrate, more particularly to a method of cyclic plasma process that enables etch profile control in features with high aspect ratio (HAR). In semiconductor device fabrication, poor etch profile control in HAR features may result in variations in critical dimension (CD) across the HAR features and poor line edge roughness (LER). This issue may be particularly challenging during a plasma etch of polysilicon used in front-end-of-line (FEOL) fabrication of advanced logic nodes. Different silicon crystalline orientation and grain boundaries of polysilicon tend to lead to variation in lateral etch rate, which can cause poor sidewall profile with surface roughness. Therefore, a plasma etch technique for polysilicon in HAR features with better etch profile control may be desired. Embodiments of the present application disclose methods of cyclic plasma process comprising a main plasma etch step and a hydrogen plasma treatment step for sidewall smoothening. The cyclic plasma process may further comprise a soft-landing etch to be performed after the last main plasma etch step.

The methods described in this disclosure may advantageously reduce the LER of HAR features formed in a layer comprising polysilicon. This may be particularly useful to fabricate a polysilicon gate or dummy gate in a 3D semiconductor device such as a fin field-effect transistor (FinFET). Further, the methods herein may improve the critical dimension (CD) control in the HAR features by providing a uniform, controlled lateral etch rate on the sidewalls. In various embodiments, features with aspect ratio (ratio of height of the feature to the width of the feature) equal to or higher than 10:1 may be enabled by the cyclic plasma process.

In the following, steps of a cyclic plasma process comprising a main plasma etch step and a hydrogen plasma treatment step for sidewall smoothening are first described referring to FIGS. 1A-1G in accordance with various embodiments. Some embodiments of the cyclic plasma process applied for a gate etch during fabricating a fin field-effect transistor (FinFET) are next described referring to FIGS. 2A-2E. Example process flow diagrams are illustrated in FIG. 3A-3C. All figures in this disclosure are drawn for illustration purpose only and not to scale, including the aspect ratios of features.

Figure 1A:
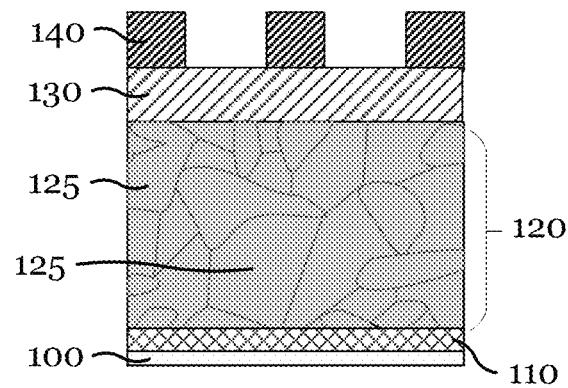

FIG. 1A illustrates a cross sectional view of an incoming substrate 100 comprising a polysilicon layer 120.

In FIG. 1A, the substrate 100 comprises a semiconductor substrate in various embodiments. In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. The substrate 100 may have undergone a number of steps of processing following, for example, a conventional process to fabricate a semiconductor structure. Accordingly, various device regions may have been formed in the substrate 100. At this stage, for example, the substrate 100 may include isolation regions such as shallow trench isolation (STI) regions as well as other regions formed therein.

The substrate 100 may further comprise an insulating layer 110. In various embodiments, the insulating layer 110 may comprise an oxide such as silicon oxide. In certain embodiments, the insulating layer 110 may be formed by thermal oxidation. In one or more embodiments, the insulating layer 110 is a layer to be fabricated as an insulating region, such as a buried oxide (BOX) layer in a semiconductor device. In one embodiment, the insulating layer 110 may have a thickness between about 10 nm to about 1 μm.

A polysilicon layer 120 is formed over the insulating layer 110. The polysilicon layer 120 illustrated in FIG. 1A is the layer to be patterned by the embodiment methods for forming high aspect ratio (HAR) features. For example, the aspect ratio (width to height) of the HAR features may be more than 1:5 or more, for example, 1:10 or more in some embodiments. In various embodiments, the polysilicon layer 120 is to be patterned to form a gate or a dummy gate for a semiconductor device. The polysilicon used in the polysilicon layer 120 may comprise a doped polysilicon to have desired material properties including electrical properties. The polysilicon layer 120 may be deposited over the insulating layer 110 using appropriate deposition techniques such as vapor deposition including chemical vapor deposition (CVD), physical vapor deposition (PVD), as well as other plasma processes such as plasma enhanced CVD (PECVD), sputtering, and other processes. In one or more embodiments, the polysilicon layer 120 may have a thickness of about 50 nm to about 500 nm. Since polysilicon is polycrystalline form of silicon, it comprises many crystallites 125 and grain boundaries between individual crystallites as illustrated in FIG. 1A.

Still referring to FIG. 1A, a hard mask layer 130 may be formed over the polysilicon layer 120. The hard mask layer 130 may comprise silicon oxide in one embodiment. In various embodiments, the hard mask layer 130 may comprise silicon nitride, silicon carbonitride (SiCN), or silicon oxycarbide (SiOC). In alternate embodiments, the hard mask layer 130 may comprise titanium nitride. In one or more embodiments, the hard mask layer 130 may comprise other suitable organic materials such as spin-on carbon hard mask (SOH) materials. Further, the hard mask layer 130 may be a stacked hard mask comprising, for example, two or more layers using two different materials. In some of such embodiments, the first hard mask of the hard mask layer 130 may comprise a metal-based layer such as titanium nitride, titanium, tantalum nitride, tantalum, tungsten based compounds, ruthenium based compounds, or aluminum based compounds, and the second hard mask material of the hard mask layer 130 may comprise a dielectric layer such as silicon oxide, silicon nitride, SiCN, SiOC, silicon oxynitride, or silicon carbide. The hard mask layer 130 may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. The hard mask layer 130 may have a thickness of about 5 nm to about 50 nm in various embodiments. In one or more embodiments, an additional layer such as silicon-containing anti-reflective coating films (SiARC) or other ARC films may be formed over the hard mask layer 130.

A patterned photoresist layer 140 may be formed over the hard mask layer 130. In various embodiments, the patterned photoresist layer 140 provides a pattern to form respective features in the polysilicon layer 120. In the illustrated example, the patterned photoresist layer 140 serves as a first etch mask when forming respective features in the hard mask layer 130 (FIG. 1B), and subsequently the formed features in the hard mask layer 130 may serve as a second etch mask during a cyclic plasma process to etch the polysilicon such that the features of the patterned photoresist layer 140 will be transferred to the polysilicon layer 120, as described below. In certain embodiments, the patterned photoresist layer 140 may comprise 248 nm resists, 193 nm resists, 157 nm resists, EUV (extreme ultraviolet) resists, or electron beam (EB) sensitive resists. In various embodiments, a photoresist may be deposited over the hard mask layer 130 using a dry process or wet process, for example, a spin-coating technique. The deposited photoresist may be then patterned with an appropriate lithographic process to form the patterned photoresist layer 140. In one embodiment, the patterned photoresist layer 140 has a thickness between 20 nm and 100 nm. Features to be patterned using the patterned photoresist layer 140 may have a desired critical dimension (CD), or width, for layers to be patterned. In some embodiments, the CD may be between 10 nm and 100 nm. In one or more embodiments, the CD may be between 10 nm and 40 nm.

Figure 1B:
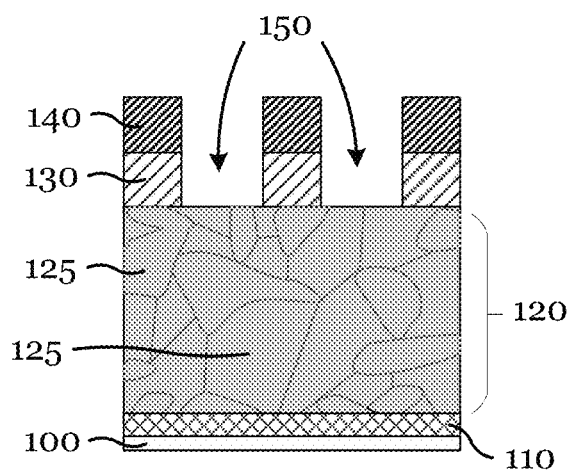

FIG. 1B illustrates a cross sectional view of semiconductor structure during fabrication after a hard mask open step in accordance with an embodiment.

The hard mask open step may be performed using a plasma etch process, for example a reactive ion etching (RIE) process, to form recesses 150 in the hard mask layer 130. The section of the hard mask layer 130 that is not masked by the patterned photoresist layer 140 may be removed, thereby transferring the pattern defined by the patterned photoresist layer 140 to the hard mask layer 130. As illustrated in FIG. 1B, at least a portion of the polysilicon layer 120 may be exposed at the bottom of the recesses 150 after the hard mask open step. In one or more embodiments, the substrate 100 may comprise additional layers above and/or below the hard mask layer 130, and the additional layers may also be removed during the hard mask open step. In certain embodiments, after the hard mask open step, the remaining portion of the patterned photoresist layer 140 may be removed prior to performing subsequent steps. In one or more embodiments, some of the patterned photoresist layer 140 may remain during subsequent steps as illustrated in FIGS. 1B-1G, but may be removed at any stage in other embodiments.

Figure 1C:
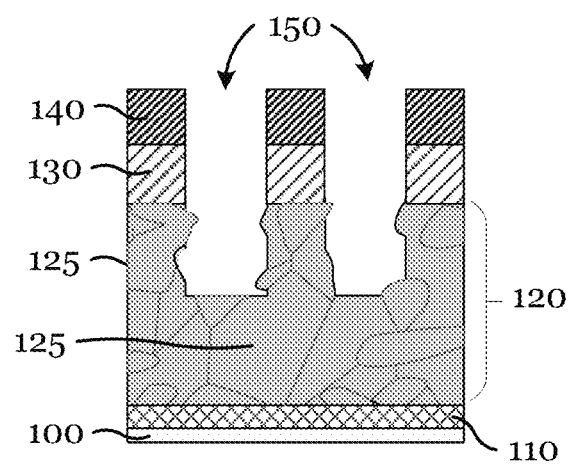

FIG. 1C illustrates a cross sectional view of semiconductor structure during fabrication after a first main etch with a first plasma of the cyclic plasma process.

The cyclic plasma process may be applied to etch polysilicon with controlled etch profile and sidewalls. A cycle of the cyclic plasma process in accordance with various embodiments may start with the main etch by exposing the substrate 100 to a first plasma. The main etch may be anisotropic to extend the recesses 150 into the polysilicon layer 120. The cyclic etch process may be performed in a suitable plasma processing chamber equipped with one or more plasma sources such as inductively coupled plasma (ICP), capacitively couple plasma (CCP), microwave plasma (MW), or others. In various embodiments, the main etch may be a reactive ion etching (RIE) process, and may use a first etch gas, for example, comprising a halogen gas. In certain embodiments, the first etch gas may hydrogen bromide (HBr) and dichlorine ($Cl_2$). The first etch gas may also comprise additive gases such as dioxygen ($O_2$) and/or noble gas (e.g., He, Ne, Ar, Kr, etc.). The first etch gas may be selected so that the first plasma to etch polysilicon has high selectivity and high polysilicon etch rate. The selectivity may be with respect to the mask material of the hard mask layer 130, for example silicon oxide, silicon nitride, or SiON. Similarly, plasma conditions for the main etch may be determined to obtain desired selectivity and etch rate.

In certain embodiments, the main etch may be performed at a total gas flow between 50 sccm and 1000 sccm, a pressure between 5 mTorr and 300 mTorr, a temperature between −10° C. and 150° C., and an operating frequency between 100 kHz and 10 GHz. In one or more embodiments, the flow rate of HBr is maintained in the range from about 0 sccm to 500 sccm and the $Cl_2$ flow rate is between about 0 sccm and 100 sccm. In one embodiment, the total flow rate of the additive gases may be in the range from about 50 sccm to 500 sccm. In various embodiments, the main etch may be performed with a process time between 5 s and 120 s, for example, 10 s to 30 s in one embodiment.

Although the main etch may primarily be an anisotropic etch with vertical directionality to extend the recesses 150 vertically, some lateral etch on the sidewalls of the recesses 150 may occur. The effect of lateral etch may especially be critical in CD control of narrow recesses and HAR features, where most of the surfaces of a patterning layer are its sidewalls. The lateral etch may lead to CD loss and line edge roughness (LER), which may severely hamper device performance and yield. These issues of undesired lateral etch may be worse in etching of polysilicon. As illustrated in FIG. 1C, due to various orientations of the crystallites 125 of the polysilicon layer 120, the sidewalls of the recesses 150 comprise different grains, and different crystal planes are exposed on surface. Because the etch rate of silicon depends on the type of crystal plane, the rate of the lateral etch during the main etch may vary across the sidewalls from the top to the bottom. As a result, the surfaces of the sidewalls may not be smooth and with poor LER. The inventors of this disclosure identified that implementing a subsequent exposure to a second plasma comprising hydrogen (e.g., $H_2$) in the cyclic plasma process, referred to as a hydrogen treatment below, can alleviate this issue by smoothening the sidewall surfaces as further described below.

At this stage after the first main etch process, the depth of the recesses 150 may be less than the total thickness of the three layers (i.e., the polysilicon layer 120, the hard mask layer 130, and the patterned photoresist layer 140). In other words, the recesses 150 do not reach to the bottom of the polysilicon layer 120. The recesses 150 are extended stepwise by repeating the main etch of the cyclic plasma process to form a high aspect ratio (HAR) feature of the polysilicon layer 120. As further described referring to FIGS. 1D-1F, stepwise removal of the polysilicon by the cyclic plasma process advantageously enables performing sidewall smoothing multiple times between steps of the cyclic plasma process.

Figure 1D:
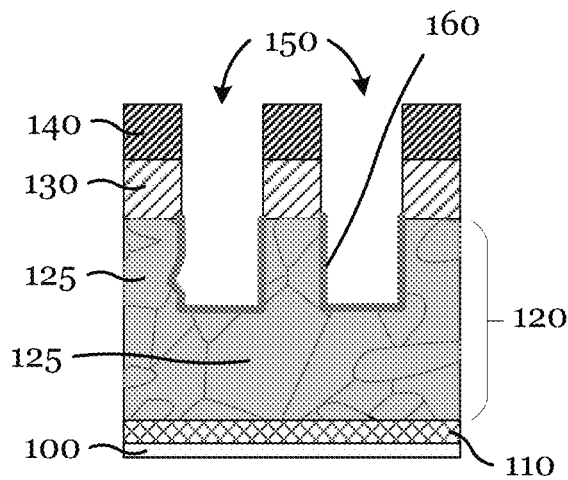

FIG. 1D illustrates a cross sectional view of semiconductor structure during fabrication after a first hydrogen treatment of the cyclic plasma process with a second plasma.

In various embodiments, a hydrogen treatment may be performed by exposing the substrate to the second plasma comprising hydrogen. In certain embodiments, the second plasma comprises molecular hydrogen i.e., dihydrogen ($H_2$). The hydrogen treatment smoothens the surfaces of the sidewalls as illustrated in FIG. 1D. Although not wishing to be limited by any theory, H-containing radical species in the second plasma may induce amorphization of a portion of polysilicon on the surface and etching of silicon atoms, which may lead to smoothening. This is illustrated in FIG. 1D as a surface modified silicon layer 160 formed on the surfaces of the recesses 150. In one or more embodiments, after the hydrogen treatment, the CD variation, for example, 3 sigma (standard deviation from a mean of CDs measured at different gate heights or depths of the recesses 150 being formed), may be reduced by 20% or more from before the hydrogen treatment. In one embodiment, the CD standard deviation—may be below 1.0 nm after the hydrogen treatment. In certain embodiments, the surface roughness may be represented by other indices such as root mean square of height variation (RMS), roughness average ($R_a$) and peak-to-valley height (h). In addition to the smoothening effect, the hydrogen treatment may advantageously improve the etch uniformity of a next cycle in the cyclic plasma process because the sidewalls may be covered with amorphous silicon and no longer has different crystal planes exposed on surface.

In certain embodiments, the hydrogen treatment may further comprise flowing an optional admixture of inert gas (e.g., He, Ne, Ar, Kr etc.) into the plasma processing chamber. In certain embodiments, the exposure to the second plasma may be performed at a total gas flow between 50 sccm and 500 sccm, a pressure between 5 mTorr and 300 Torr, a temperature between −10° C. and 200° C., and an operating frequency between 100 kHz and 10 GHz. In various embodiments, the exposure to the second plasma may be performed with a process time between 2 s and 50 s, for example, 5 s to 10 s in one embodiment. Some process parameters such as flow rate, pressure may be selected to provide sufficient modification of the sidewall surfaces, while keeping process time as short as possible for better process efficiency. Further, process parameters for the hydrogen plasma step may be optimized with respect to the previous steps of the cyclic plasma process (e.g., FIG. 1C). In certain embodiments, inductively coupled plasma (ICP), microwave plasma (MW), or capacitively coupled plasma (CCP) can be used for the second plasma comprising hydrogen. In one example, in an ICP plasma chamber, a process condition with chamber pressure of 30-80 mTorr, source power of 250-1000 W, and $H_2$ flow of 100-200 sccm may be used.

In various embodiments, steps of the main etch and the hydrogen treatment may be repeated in the cyclic plasma process to reach the desired depth for the recesses 150. For example, a second main etch may be performed after the first hydrogen treatment (e.g., FIG. 1D) to extend the recesses 150 vertically. The sidewall surfaces may be smoothened and amorphized by the first hydrogen treatment, the second main etch may proceed with better etch profile control compared with the first main etch. The process conditions of the second main etch may be the same as the first main etch in some embodiments, but may be different in other embodiments. After the second main etch, a second hydrogen treatment may be performed to treat and smoothen the newly exposed sidewall and bottom surfaces of the recesses 150, replenishing the surface modified silicon layer 160. The process conditions of the second hydrogen treatment may be the same as the first hydrogen treatment in some embodiments, but may be different in other embodiments. In one or more embodiments, during the cycle of repeating the main etch and the hydrogen treatment, one or more step of the main etch or the hydrogen treatment may be skipped or replaced with a different intervening process step according to a process recipe.

Figure 1E:
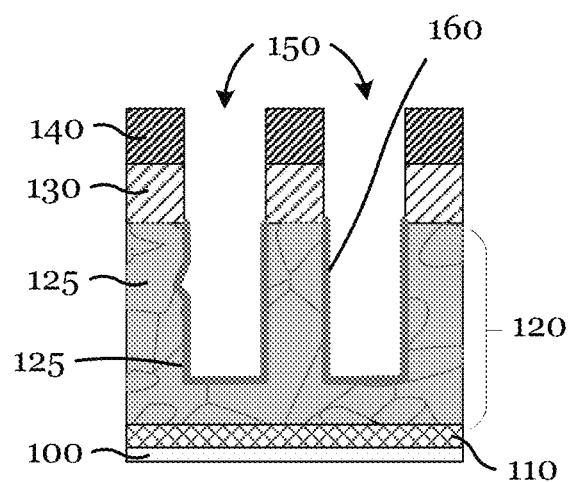

FIG. 1E illustrates the substrate 100 after cycles of steps of the cyclic plasma process.

In FIG. 1E, the recess 150 vertically extends in the polysilicon layer 120 after the cycles of steps. The surface modified silicon layer 160 may also be extended after the final hydrogen treatment. By performing a plurality of cycles of the cyclic etch process in accordance with various embodiments, the recess 150 may extend stepwise and conformally without much variation in critical dimension (CD) from the recess top to bottom. In various embodiments, any number of cycles may be performed until a desired level of etching may be achieved. In certain embodiments, the cycles may end with the main etch and the final hydrogen treatment may be skipped. Whether the final hydrogen treatment is needed or not may depend on the final etch profile which is largely determined by the polycrystalline condition of the surface modified silicon layer 160 at the film depth. In one or more embodiments, after the final main etch and the final hydrogen treatment, the bottom of the recess 150 may still be above the insulating layer 110 as illustrated in FIG. 1E, and subsequent steps comprising a soft-landing etch may further extend the recess 150 as below.

Figure 1F:
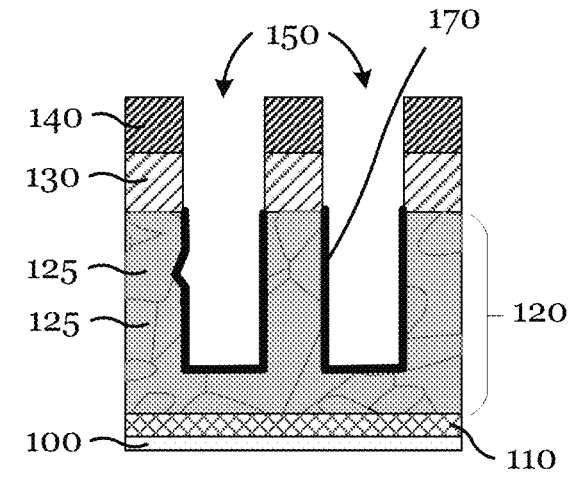

FIG. 1F illustrates a cross sectional view of semiconductor structure during fabrication after a surface treatment to form a protective surface layer 170.

After the cycles of the main etch and the hydrogen treatment, the surface treatment may be performed to form the protective surface layer 170. The protective surface layer 170 is to provide sidewall protection during the subsequent soft-landing etch. In certain embodiments, the surface treatment comprises exposing the substrate to a reactive gas that induces a surface reaction with the silicon atoms on the sidewall. For example, the reactive gas comprising oxygen (e.g., $O_2$, CO or $CO_2$) and a thin layer comprising an oxide (e.g., silicon oxide) may be formed as the protective surface layer 170. In alternate embodiments, the reactive gas may comprise nitrogen (e.g., $N_2$, $NH_3$, etc.) and the protective surface layer 170 may comprise a nitride (e.g., silicon nitride). In one or more embodiments, the surface treatment is a plasma process. It is also possible, in the surface treatment, to deposit a new material for the protective surface layer 170 over silicon. In some embodiments, various deposition techniques may be used, such as vapor deposition including chemical vapor deposition (CVD), physical vapor deposition (PVD), atomic layer deposition (ALD), as well as other plasma processes such as plasma enhanced CVD (PECVD) and other processes. In one example, in an ICP plasma chamber, a process condition with chamber pressure of 80-120 mTorr, source power of 100-300 W and 0-50 W bias power, and $O_2$ flow of 100-200 sccm with Ar flow of 200-500 sccm is used.

Figure 1G:
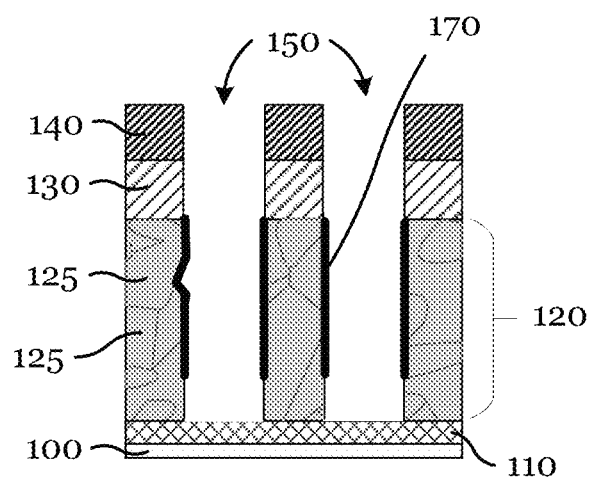

FIG. 1G illustrates a cross sectional view of semiconductor structure during fabrication after a soft-landing etch with a third plasma.

In various embodiments, the cyclic plasma process may further comprise another etch process, referred to as the soft-landing etch in this disclosure, with different process conditions from the main etch. The purpose of the soft-landing etch is to further remove polysilicon to fabricate the target high aspect ratio (HAR) features in the polysilicon layer 120 while preventing any damage to other components or feature on the substrate 100. For example, the soft-landing etch may have higher etch selectivity (e.g., polysilicon-to-oxide selectivity) than the main etch so that the insulating layer 110 and other possible features (e.g., a fin feature as illustrated below in FIGS. 2A-2E) are not impacted. As illustrated in FIG. 1G, the soft-landing etch further extends the recesses 150 and may expose the insulating layer 110 in various embodiments. The soft-landing etch may be a reactive ion etching (RIE) process, and may use a second etch gas, for example, comprising a halogen gas. In certain embodiments, the second etch gas may hydrogen bromide (HBr) and dichlorine ($Cl_2$). The second etch gas may also comprise additive gases such as dioxygen ($O_2$) and/or noble gas (e.g., He, Ne, Ar, Kr, etc.). In some embodiments, the composition of the second etch gas for the soft-landing etch may be the same as the first etch gas for the main etch, but in other embodiments may be different. The second etch gas may be selected so that the third plasma to etch polysilicon during the soft-landing etch has selectivity higher than that of the first plasma during the main etch. The selectivity may be with respect to the mask material of the hard mask layer 130, the insulating layer 110, the fin structure or other features. Similarly, plasma conditions for the soft-landing etch may be determined to obtain desired selectivity. For this reason, in one embodiment, the etch rate of the soft-landing etch may be less than the etch rate of the main etch. Accordingly, the process time of the soft-landing etch may be longer than that of the main etch. The formation of the protective surface layer 170 described above referring to FIG. 1F, therefore, may be particularly useful in sidewall protection during the soft-landing etch. In various embodiments, the amount of polysilicon to be etched by the soft-landing etch is less than the amount of polysilicon to be etched by the cycles of the main etch.

In certain embodiments, the soft-landing etch may be performed at a total gas flow between 100 sccm and 1000 sccm, a pressure between 10 m Torr and 800 mTorr, a temperature between −10° C. and 200° C., and an operating frequency between 100 kHz and 10 GHz. In one or more embodiments, the flow rate of HBr is maintained in the range from about 100 sccm to 500 sccm and the $Cl_2$ flow rate is between about 0 sccm and 300 sccm. In one embodiment, the total flow rate of the additive gases may be in the range from about 0 sccm to 200 sccm. In various embodiments, the main etch may be performed with a process time between 2 s and 120 s, for example, 10 s to 50 s in one embodiment. To achieve high selectivity in the soft-landing step, the process may be performed at a condition with higher chamber pressure, lower bias power, higher additive flow rates (e.g., $O_2$, $CO_2$, or $N_2$) for more surface deposition, compared to the main etch process conditions.

FIGS. 2A-2E illustrate perspective views of an example substrate during an example cyclic plasma process for fabricating a three-dimensional (3D) semiconductor device at various stages in accordance with various embodiments. The cyclic plasma process in accordance with various embodiments in this disclosure may be applied and particularly useful in fabricating a 3D semiconductor device. FIGS. 2A-2E illustrate an example for a fin field-effect transistor (FinFET), although other 3D semiconductor device may be fabricated utilizing the method of etching polysilicon described in this disclosure. Process details may be the same as already described above and may not be repeated.

Figure 2A:
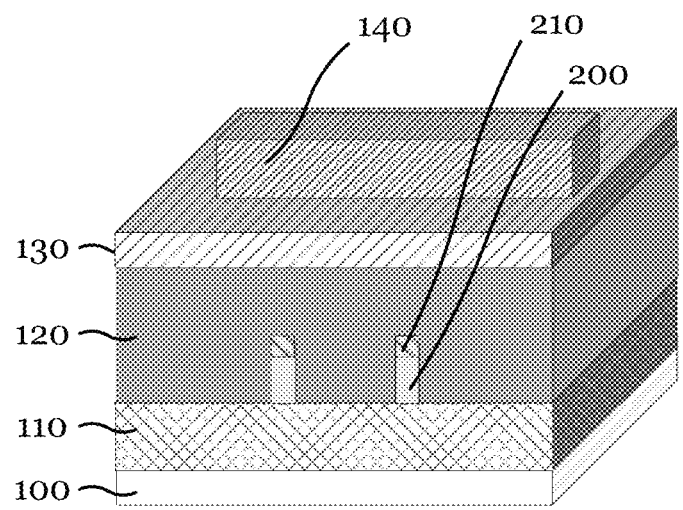

In FIG. 2A, the substrate 100 comprises the same features as illustrated above in FIG. 1A, including an insulating layer 110, a polysilicon layer 120, a hard mask layer 130, and a patterned photoresist layer 140. Further, the substrate 100 in FIG. 2A comprises a fin feature having fins 200 comprising a semiconductor material and fin hard mask 210 formed over the fins 200. It should be noted that while two fins 200 are depicted in FIG. 2A for illustration purpose, the number of fins is not limited. In various embodiments, the fins 200, at the end of fabrication, may form the transistor channels in a FinFET device. In one or more embodiments, the fins 200 may have a height between about 20 nm to about 100 nm and a width between about 5 nm to about 30 nm. While the fabrication of a SOI FinFET is illustrates in FIGS. 2A-2E, the cyclic plasma process is applicable to the fabrication of a bulk FinFET, where the fins 200 will be tied with and connected to the substrate 100 directly.

In certain embodiments, the fins 200 comprise silicon, silicon germanium, or other semiconductor materials. An n-type field effect transistor or a p-type field effect transistor may be formed with different types of materials being used for the fins 200 in some embodiments. For example, n-FETs may be fabricated with using materials for the fins 200 having high electron mobility while p-FETs may be fabricated with using materials for the fins 200 having high hole mobility. In one or more embodiments, the fins 200 may be selected to be a material selected from Groups III-V of the periodic table.

The fin feature may be formed by a conventional method, for example, by depositing a layer of material for the fins 200, depositing the fin hard mask 210, patterning the fin hard mask to define the pattern for the fins 200, and etching the material for the fins 200 using the patterned fin hard mask as an etch mask. In some embodiments, the deposition of the layer of material for the fins 200 may be formed by deposition processes, for example, epitaxially by a chemical vapor deposition (CVD) method.

The fin hard mask 210 may comprise silicon oxide in one embodiment. In various embodiments, the fin hard mask 210 may comprise silicon nitride, silicon carbonitride (SiCN), or silicon oxycarbide (SiOC). The fin hard mask 210 may be deposited using suitable deposition techniques such as vapor deposition including chemical vapor deposition (CVD), physical vapor deposition (PVD), as well as other plasma processes such as plasma enhanced CVD (PECVD), sputtering, and other processes. The fin hard mask 210 may be then patterned, for example, by a lithographic process and an etch process. In certain embodiments, the fin hard mask 210 may be removed prior to forming the polysilicon layer 120.

The fin feature may then be buried in the polysilicon layer 120 after depositing the polysilicon layer 120. The polysilicon layer 120 may be used to form a dummy gate in one embodiment. The deposition of the polysilicon layer 120 and subsequent steps of depositing the hard mask layer 130 and forming the patterned photoresist may be performed as previously described referring to FIG. 1A.

Figure 2B:
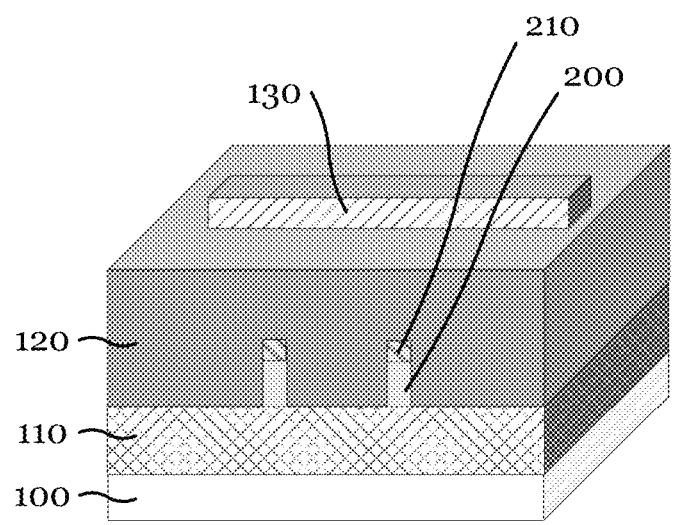
Figure 3A:
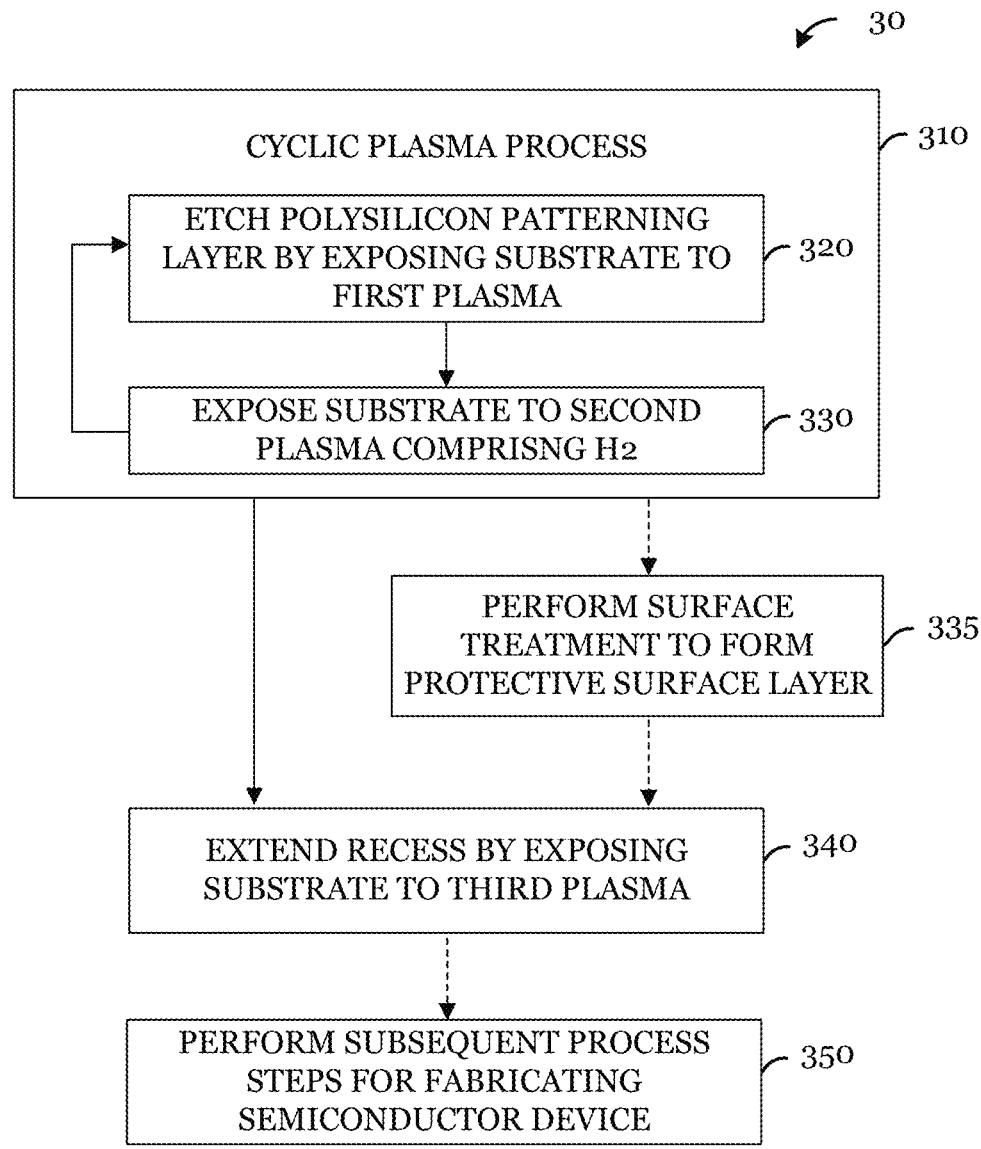
Figure 3B:
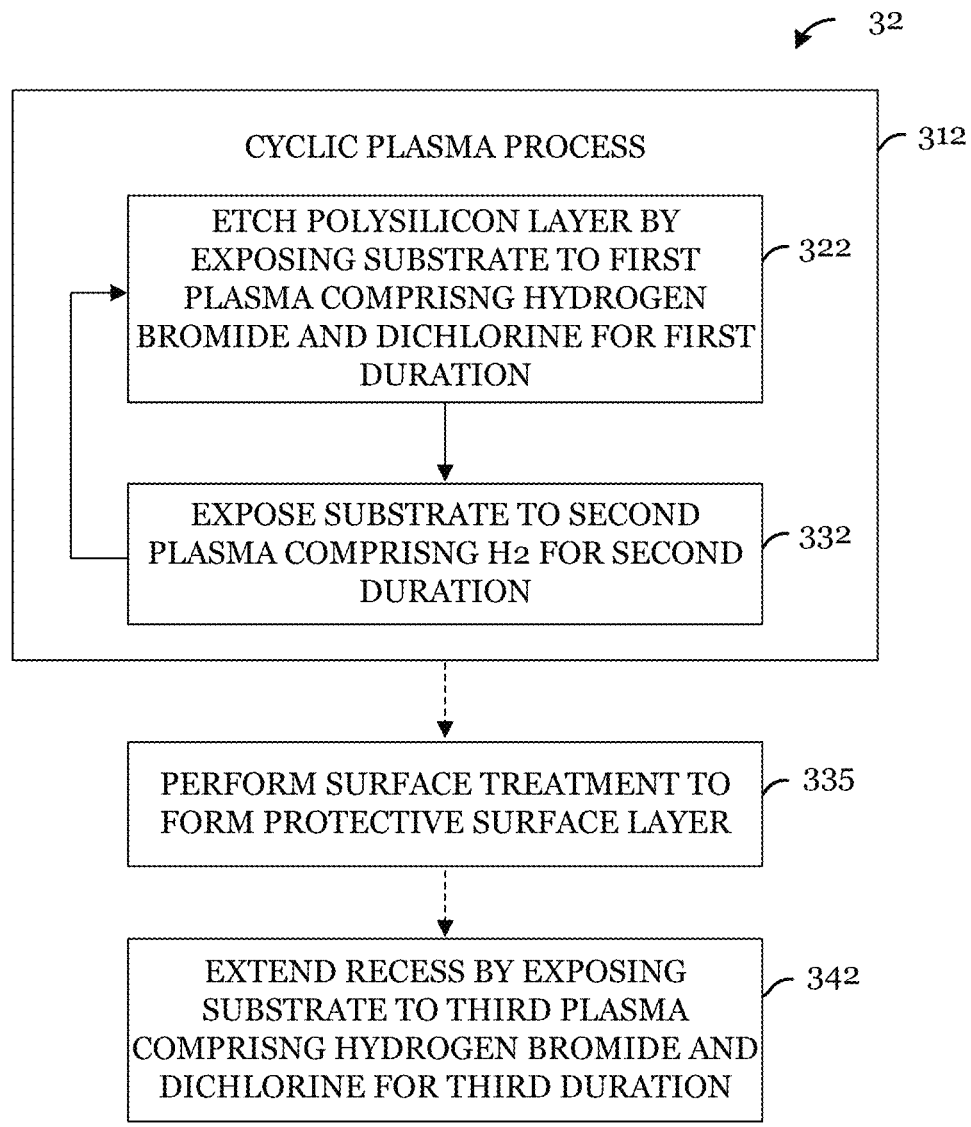
Figure 3C:
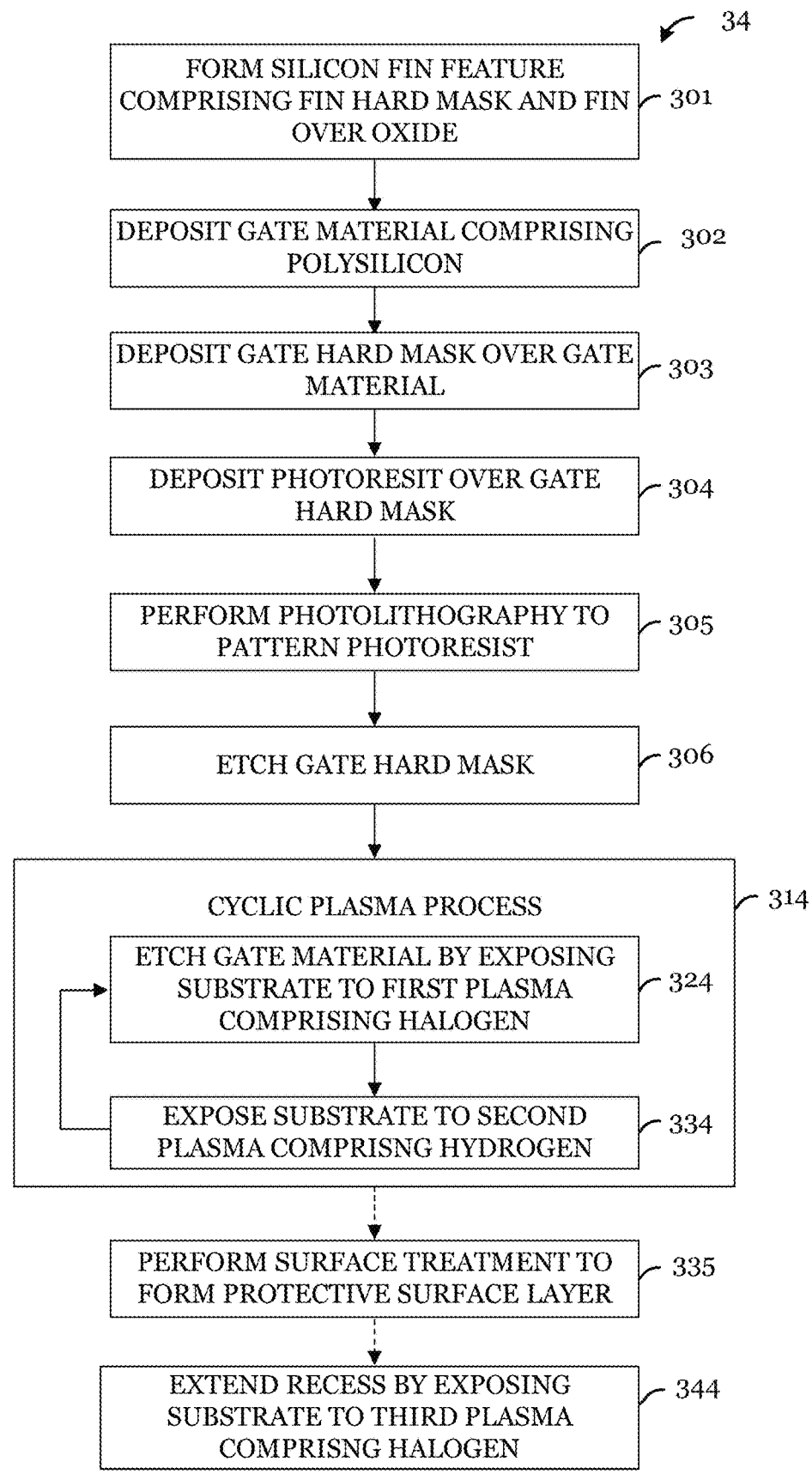

FIG. 2B illustrates a perspective view of semiconductor structure during fabrication after a hard mask open step.

The hard mask open step may be performed using a plasma etch process, for example a reactive ion etching (RIE) process as previously described referring to FIG. 1B. Accordingly, the pattern of the patterned photoresist layer 140 may be transferred to the hard mask layer 130. As illustrated in FIG. 2B, the remaining portion of the patterned photoresist layer 140 may be removed after the hard mask open step, for example by ashing.

Figure 2C:
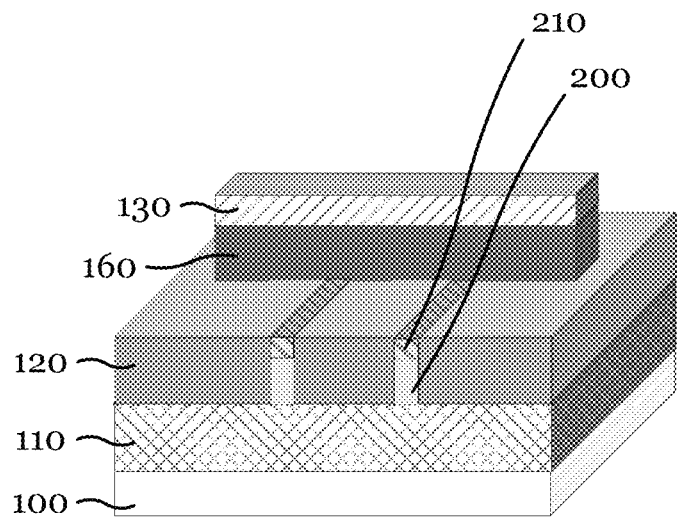

FIG. 2C illustrates a perspective view of semiconductor structure during fabrication after cycles of steps of the cyclic plasma process.

Similar to prior embodiments, cycles of the main etch and the hydrogen treatment may be performed to etch the polysilicon layer 120 with the patterned hard mask layer 130 as an etch mask. Although only one line feature is illustrated for illustration purpose, the high aspect ratio (HAR) features comprising a plurality of lines and recesses are assumed in various embodiments. As illustrated in FIG. 2C, the cycles of the cyclic plasma process may end with the final hydrogen treatment, and therefore a surface modified silicon layer 160 may cover the surface of the polysilicon layer that was exposed by the main etch. In other embodiments, the final hydrogen treatment may be skipped and the sidewalls of the polysilicon layer 120 may be exposed. In various embodiments, the cycles may be stopped when the top surfaces of the fin feature (e.g., top surfaces of the fin hard mask 210 in FIG. 2C) are first exposed so that further removal of polysilicon in the polysilicon layer 120 may separately be performed by a more selective etch, for example a soft-landing etch as described below.

Figure 2D:
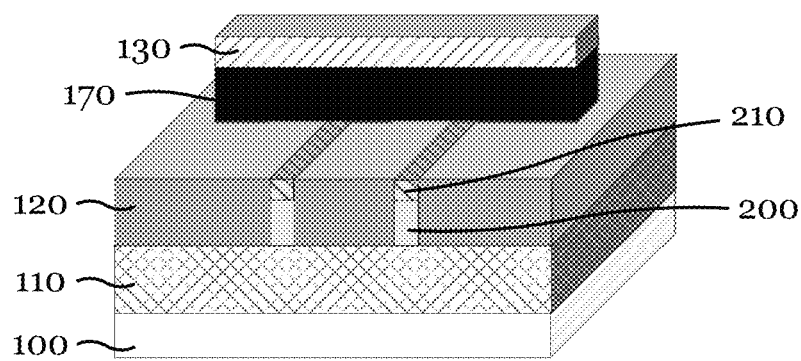

FIG. 2D illustrates a perspective view of semiconductor structure during fabrication after a surface treatment to form a protective surface layer 170.

Figure 2E:
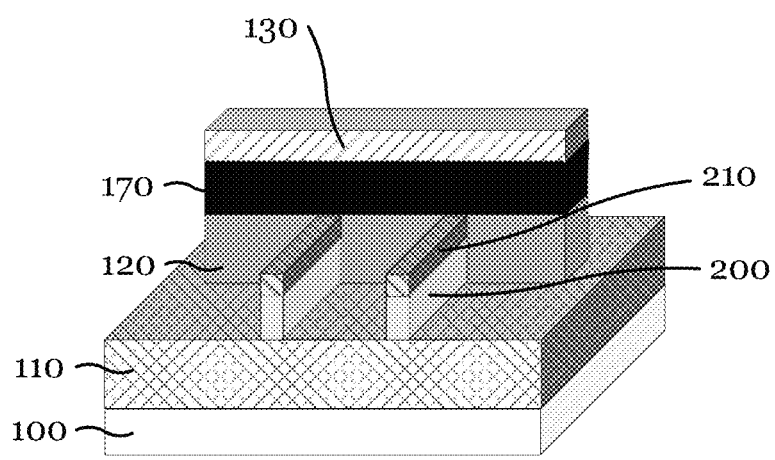

Prior to the soft-landing etch as illustrated in FIG. 2E, the surface treatment to form the protective surface layer 170 may be performed as previously described referring to FIG. 1F. The protective surface layer 170 may cover or replace the surface of the surface modified silicon layer 160 and any exposed portion of the polysilicon layer 120.

FIG. 2E illustrates a perspective view of semiconductor structure during fabrication after a soft-landing etch forming a dummy gate feature wrapping the fin feature.

The soft-landing etch may be next performed to further etch polysilicon with selectivity higher than that of the main etch. Process conditions of the soft-landing etch for polysilicon may be selected so as to minimize or eliminate damages to other components such as the insulating layer 110 and the fins 200, and the fin hard mask 210. After the soft-landing etch, subsequent process steps for fabricating a semiconductor device such as FinFET may follow. In one embodiment, such steps may be including but not limited to gate spacer formation, gate implantation, fin recess and source/drain formation, channel release, and middle-of-line (MOL)/back-end-of-line (BEOL) processes.

FIGS. 3A-3C illustrate process flow charts of methods of cyclic plasma process in accordance with various embodiments. The process flow can be followed with the figures discussed above and hence will not be described again.

In FIG. 3A, a process flow 30 starts with a cyclic plasma process 310 comprising, as a main etch, etching a patterning layer comprising polysilicon to form a recess by exposing the substrate to a first plasma (block 320, FIG. 1C). Next in the loop of the cyclic plasma process 310, as a hydrogen treatment, the substrate may be exposed to a second plasma comprising dihydrogen ($H_2$) (block 330, FIG. 1D). The main etch and the hydrogen treatment may be repeated for any number of times to extend the recess (e.g., FIG. 1E). The substrate may be then exposed to a third plasma, for a soft-landing etch, to further extend the recess (block 340, FIG. 1G). In certain embodiments, an optional surface treatment to form a protective surface layer may be performed (block 335, FIG. 1F) prior to the soft-landing etch (block 340). In certain embodiments, subsequent fabrication process steps (e.g., gate spacer formation) fabricating a semiconductor device may be performed (block 350).

In FIG. 3B, another process flow 32 starts with a cyclic plasma process 312 comprising, as a main etch, etching a polysilicon layer to form a recess by exposing the substrate to a first plasma comprising hydrogen bromide (HBr) and dichlorine ($Cl_2$) for a first duration (block 322, FIG. 1C). Next, as a hydrogen treatment, the substrate may be exposed to a second plasma comprising dihydrogen ($H_2$) for a second duration (block 332, FIG. 1D). The main etch and the hydrogen treatment may be repeated for any number of times to extend the recess (e.g., FIG. 1E). In certain embodiments, a surface treatment to form a protective surface layer may be performed (block 335, FIG. 1F), followed by a soft-landing etch, where the substrate may be exposed to a third plasma comprising hydrogen bromide (HBr) and dichlorine ($Cl_2$) for a third duration (block 342, FIG. 1G).

In FIG. 3C, yet another process flow 34 starts with forming a fin feature comprising a find hard mask and a silicon fin over an oxide layer (block 301). Next, a dummy gate material comprising polysilicon may be deposited (block 302), followed by depositing a gate hard mask layer over the dummy gate material (block 303). Over the gate hard mask layer, a photoresist is then deposited (block 304) and patterned by performing a photolithographic process (block 305, FIG. 2A). The gate hard mask layer may be etched next to transfer the pattern from the photoresist to the hard mask layer (block 306, FIG. 2B). A cyclic plasma process (block 314) may follow to etch the dummy gate material using the patterned gate hard mask layer as an etch mask. The cyclic plasma process may start with a main etch by exposing the substrate to a first plasma comprising a halogen to form or extend a recess in the dummy gate material (block 324). Next, as a hydrogen treatment, the substrate may be exposed to a second plasma comprising hydrogen (block 334). The main etch and the hydrogen treatment may be repeated for any number of times to extend the recess. In one or more embodiments, the cyclic plasma process may be continued until the top surfaces of the fin hard mask are exposed at the bottom of the recess (e.g., FIG. 2C). In certain embodiments, the process flow 34 continues for a surface treatment to form a protective surface layer (block 335, FIG. 2D), followed by a soft-landing etch, where the substrate may be exposed to a third plasma comprising a halogen (block 344, FIG. 1G). In one or more embodiments, the soft-landing etch may extend the recess to expose the oxide layer.

Example embodiments are summarized here. Other embodiments can also be understood from the entirety of the specification as well as the claims filed herein.

Example 1. A method of processing a substrate that includes: performing a cyclic plasma etch process including a plurality of cycles, each of the plurality of cycles including: etching a patterning layer including a polycrystalline semiconductor material to form or extend a recess by exposing the substrate to a first plasma, the substrate including an oxide layer, the patterning layer formed over the oxide layer, exposing the substrate to a second plasma, the second plasma including dihydrogen, and extending the recess by exposing the substrate to a third plasma, the second plasma being different from the first plasma and the third plasma.

Example 2. The method of example 1, further including, before performing the cyclic plasma etch process, forming a patterned hard mask layer over the patterning layer by a lithographic process and an etch, and where the cyclic plasma etch process is performed using the hard mask layer as an etch mask.

Example 3. The method of one of examples 1 or 2, further including, after performing the cyclic plasma etch process and before extending the recess by exposing the substrate to the third plasma, performing a surface treatment to form a protective surface layer on surfaces of the recess, the protective surface layer protecting sidewalls of the recess during extending the recess by exposing the substrate to the third plasma.

Example 4. The method of one of examples 1 to 3, where the surface treatment includes exposing the substrate to a reactive gas, the reactive gas including oxygen, and where the protective surface layer include an oxide.

Example 5. The method of one of examples 1 to 4, where the surface treatment includes exposing the substrate to a reactive gas, the reactive gas including nitrogen, and where the protective surface layer include a nitride.

Example 6. The method of one of examples 1 to 5, where the first plasma includes a halogen.

Example 7. The method of one of examples 1 to 6, where the first plasma includes hydrogen bromide and dichlorine.

Example 8. The method of one of examples 1 to 7, where exposing the substrate to the second plasma amorphizes the polycrystalline semiconductor material at surfaces of the recess.

Example 9. The method of one of examples 1 to 8, where exposing the substrate to the second plasma smoothens surfaces of the sidewalls of the recess.

Example 10. The method of one of examples 1 to 9, where the third plasma includes a halogen.

Example 11. The method of one of examples 1 to 10, where the third plasma includes hydrogen bromide and dichlorine.

Example 12. The method of one of examples 1 to 11, where an etch rate of the polycrystalline semiconductor material during exposing the substrate to the third plasma is slower than an etch rate of the polycrystalline semiconductor material during exposing the substrate to the first plasma.

Example 13. The method of one of examples 1 to 12, where the recess extended by exposing the substrate to the third plasma has a height-to-width ratio between about 5 to 10.

Example 14. A method of processing a substrate that includes: performing a cyclic plasma etch process including a plurality of cycles, each of the plurality of cycles including: etching a polysilicon layer to form a recess by exposing the substrate to a first plasma for a first duration, the substrate including an oxide layer, the polysilicon layer formed over the oxide layer, the first plasma including hydrogen bromide and dichlorine, and exposing the substrate to a second plasma for a second duration, the second plasma including dihydrogen.

Example 15. The method of example 14, where the first duration is between 5 s to 120 s, and where the second duration is between 2 s to 50 s.

Example 16. The method of one of examples 14 or 15, where exposing the substrate to the second plasma amorphizes the polysilicon layer at surfaces of the recess and reduce a standard deviation of critical dimensions of the recess at different depths by 20% or more.

Example 17. The method of one of examples 14 to 16, further including, after performing the cyclic plasma etch process: performing a surface treatment to form a protective surface layer on surfaces of the recess; and further extending the recess in the layer by an etch process including exposing the substrate including a third plasma for a third duration, the third plasma including hydrogen bromide and dichlorine, the protective surface layer protecting sidewalls of the recess from the third plasma.

Example 18. The method of one of examples 14 to 17, where the third duration is longer than the first duration.

Example 19. A method of fabricating a fin field-effect transistor that includes: forming a fin feature over an oxide layer, the oxide layer formed over the substrate, the fin feature including a fin hard mask and a fin under the fin hard mask, the fin including silicon; depositing a dummy gate material including polysilicon; depositing a gate hard mask layer over the dummy gate material; depositing a photoresist over the hard mask layer; performing a photolithographic process to pattern the photoresist; etching the gate hard mask layer to transfer a pattern from the photoresist to the hard mask layer; and performing a cyclic plasma etch process using the gate hard mask layer as an etch mask, the cyclic plasma etch process exposing the fin hard mask, the cyclic plasma etch process including a plurality of cycles, each of the plurality of cycles including: etching the dummy gate material to form a recess by exposing the substrate to a first plasma, the first plasma including a halogen; and exposing the substrate to a second plasma, the second plasma including hydrogen.

Example 20. The method of example 19, further including, after performing the cyclic plasma etch process, extending the recess by exposing the substrate to a third plasma, the third plasma including a halogen, where performing the cyclic plasma etch process exposes top surfaces of the fin hard mask, and where extending the recess by exposing the substrate to the third plasma exposes the oxide layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   performing a cyclic plasma etch process comprising a plurality of cycles, each of the plurality of cycles comprising:
      etching a patterning layer comprising a polycrystalline semiconductor material to form or extend a recess by exposing the substrate to a first plasma, the substrate comprising an oxide layer, the patterning layer formed over the oxide layer, and
      exposing the substrate to a second plasma, the second plasma comprising dihydrogen, wherein exposing the substrate to the second plasma amorphizes the polycrystalline semiconductor material at surfaces of the recess; and
   extending the recess by exposing the substrate to a third plasma, the second plasma being different from the first plasma and the third plasma.

2. The method of claim 1, further comprising, before performing the cyclic plasma etch process, forming a patterned hard mask layer over the patterning layer by a lithographic process and an etch, and wherein the cyclic plasma etch process is performed using the patterned hard mask layer as an etch mask.

3. The method of claim 1, further comprising, after performing the cyclic plasma etch process and before extending the recess by exposing the substrate to the third plasma, performing a surface treatment to form a protective surface layer on the surfaces of the recess, the protective surface layer protecting sidewalls of the recess during extending the recess by exposing the substrate to the third plasma.

4. The method of claim 3, wherein the surface treatment comprises exposing the substrate to a reactive gas, the reactive gas comprising oxygen, and wherein the protective surface layer comprise an oxide.

5. The method of claim 3, wherein the surface treatment comprises exposing the substrate to a reactive gas, the reactive gas comprising nitrogen, and wherein the protective surface layer comprise a nitride.

6. The method of claim 1, wherein the first plasma comprises a halogen.

7. The method of claim 6, wherein the first plasma comprises hydrogen bromide and dichlorine.

8. The method of claim 1, wherein exposing the substrate to the second plasma smoothens surfaces of sidewalls of the recess.

9. The method of claim 1, wherein the third plasma comprises a halogen.

10. The method of claim 1, wherein the third plasma comprises hydrogen bromide and dichlorine.

11. The method of claim 1, wherein an etch rate of the polycrystalline semiconductor material during exposing the substrate to the third plasma is slower than an etch rate of the polycrystalline semiconductor material during exposing the substrate to the first plasma.

12. The method of claim 1, wherein the recess extended by exposing the substrate to the third plasma has a height-to-width ratio between about 5 to 10.

13. The method of claim 1, wherein the second plasma is a hydrogen plasma generated from dihydrogen.

14. A method of processing a substrate, the method comprising:
  performing a cyclic plasma etch process comprising a plurality of cycles, each of the plurality of cycles comprising:
    etching a polysilicon layer to form a recess by exposing the substrate to a first plasma for a first duration, the substrate comprising an oxide layer, the polysilicon layer formed over the oxide layer, the first plasma comprising hydrogen bromide and dichlorine, and
    exposing the substrate to a second plasma for a second duration, the second plasma comprising dihydrogen, wherein exposing the substrate to the second plasma smoothens surfaces of sidewalls of the recess.

15. The method of claim 14, wherein the first duration is between 5 s to 120 s, and wherein the second duration is between 2 s to 50 s.

16. The method of claim 14, wherein exposing the substrate to the second plasma amorphizes the polysilicon layer at surfaces of the recess and reduce a standard deviation of critical dimensions of the recess at different depths by 20% or more.

17. The method of claim 14, further comprising, after performing the cyclic plasma etch process:
  performing a surface treatment to form a protective surface layer on surfaces of the recess; and
  further extending the recess in the polysilicon layer by an etch process comprising exposing the substrate comprising a third plasma for a third duration, the third plasma comprising hydrogen bromide and dichlorine, the protective surface layer protecting the sidewalls of the recess from the third plasma.

18. The method of claim 17, wherein the third duration is longer than the first duration.

19. A method of fabricating a fin field-effect transistor, the method comprising:
  forming a fin feature over an oxide layer, the oxide layer formed over a substrate, the fin feature comprising a fin hard mask and a fin under the fin hard mask, the fin comprising silicon;
  depositing a dummy gate material comprising polysilicon;
  depositing a gate hard mask layer over the dummy gate material;
  depositing a photoresist over the gate hard mask layer;
  performing a photolithographic process to pattern the photoresist;
  etching the gate hard mask layer to transfer a pattern from the photoresist to the gate hard mask layer; and
  performing a cyclic plasma etch process using the gate hard mask layer as an etch mask, the cyclic plasma etch process exposing the fin hard mask, the cyclic plasma etch process comprising a plurality of cycles, each of the plurality of cycles comprising:
    etching the dummy gate material to form a recess by exposing the substrate to a first plasma, the first plasma comprising a halogen; and
    exposing the substrate to a second plasma, the second plasma comprising hydrogen, wherein exposing the substrate to the second plasma smoothens surfaces of sidewalls of the recess.

20. The method of claim 19, further comprising, after performing the cyclic plasma etch process, extending the recess by exposing the substrate to a third plasma, the third plasma comprising a halogen, wherein performing the cyclic plasma etch process exposes top surfaces of the fin hard mask, and wherein extending the recess by exposing the substrate to the third plasma exposes the oxide layer.

21. The method of claim 19, wherein exposing the substrate to the second plasma amorphizes the dummy gate material at surfaces of the recess.

* * * * *